United States Patent [19]
Sato

[11] Patent Number: 5,539,655
[45] Date of Patent: Jul. 23, 1996

[54] APPARATUS FOR DETECTING OUT OF PHASE OF POWER SYSTEMS AND METHOD FOR DETECTING THE SAME

[75] Inventor: Masahiro Sato, Kawasaki, Japan

[73] Assignee: Kabushiki Kaisha Toshiba, Kawasaki, Japan

[21] Appl. No.: 216,426

[22] Filed: Mar. 23, 1994

[30] Foreign Application Priority Data

Mar. 25, 1993  [JP]  Japan .................................. 5-090777

[51] Int. Cl.⁶ .................................................. G01R 25/00
[52] U.S. Cl. ........................ 364/494; 364/492; 324/76.74; 324/76.77; 322/20; 323/212
[58] Field of Search .................................. 364/483, 492, 364/494, 495, 554; 324/424, 76.52, 76.74, 76.77, 141, 142; 322/20–25; 361/85; 323/205, 207, 212; 331/1 R; 363/98

[56] References Cited

U.S. PATENT DOCUMENTS

| | | | |
|---|---|---|---|
| 4,249,088 | 2/1981 | Kleba et al. | 364/494 |
| 4,757,263 | 7/1988 | Cummings, III et al. | 364/551.01 |
| 4,996,471 | 2/1991 | Gallo | 343/241 |
| 5,107,447 | 4/1992 | Ozawa et al. | 364/551.01 |

FOREIGN PATENT DOCUMENTS

| | | |
|---|---|---|
| 4-52051 | 8/1992 | Japan . |
| 4-65618 | 10/1992 | Japan . |

OTHER PUBLICATIONS

Takahashi et al., "Fast Generation Shedding Equipment Based on the Observation of Swings of Generators," *IEEE Transactions of Power Systems*, vol. 3, No. 2, May 1988, pp. 439–446.

Ohura et al., "A predictive out-of-step protection system based on observation of the phase difference between substations," *IEEE Transaction on Power Delivery*, vol. 5, No. 4, Nov. 1990, pp. 1695–1704.

*Primary Examiner*—Emanuel T. Voeltz
*Assistant Examiner*—Kyle J. Choi
*Attorney, Agent, or Firm*—Oblon, Spivak, McClelland, Maier & Neustadt

[57] ABSTRACT

An out of phase detecting apparatus according to the present invention includes a measurement unit for measuring an effective power and a current effective value at a tie point of power systems at a predetermined cycle, a power trend detection unit for detecting a trend of the effective powers measured in sequence by the measurement unit, a current trend detection unit for detecting a trend of the current effective values measured in sequence by the measurement unit, a power level determination unit for determining a relationship in strength between each of the measured powers and a steady effective power $P_0$ obtained when the power systems are in a steady state, and an out of phase detection unit for detecting whether an out of phase condition occurs in the power systems based on the trend of the measured effective powers, the trend of the measured current effective values, and the relationship in strength between the steady effective power $P_0$ and each effective power.

29 Claims, 13 Drawing Sheets

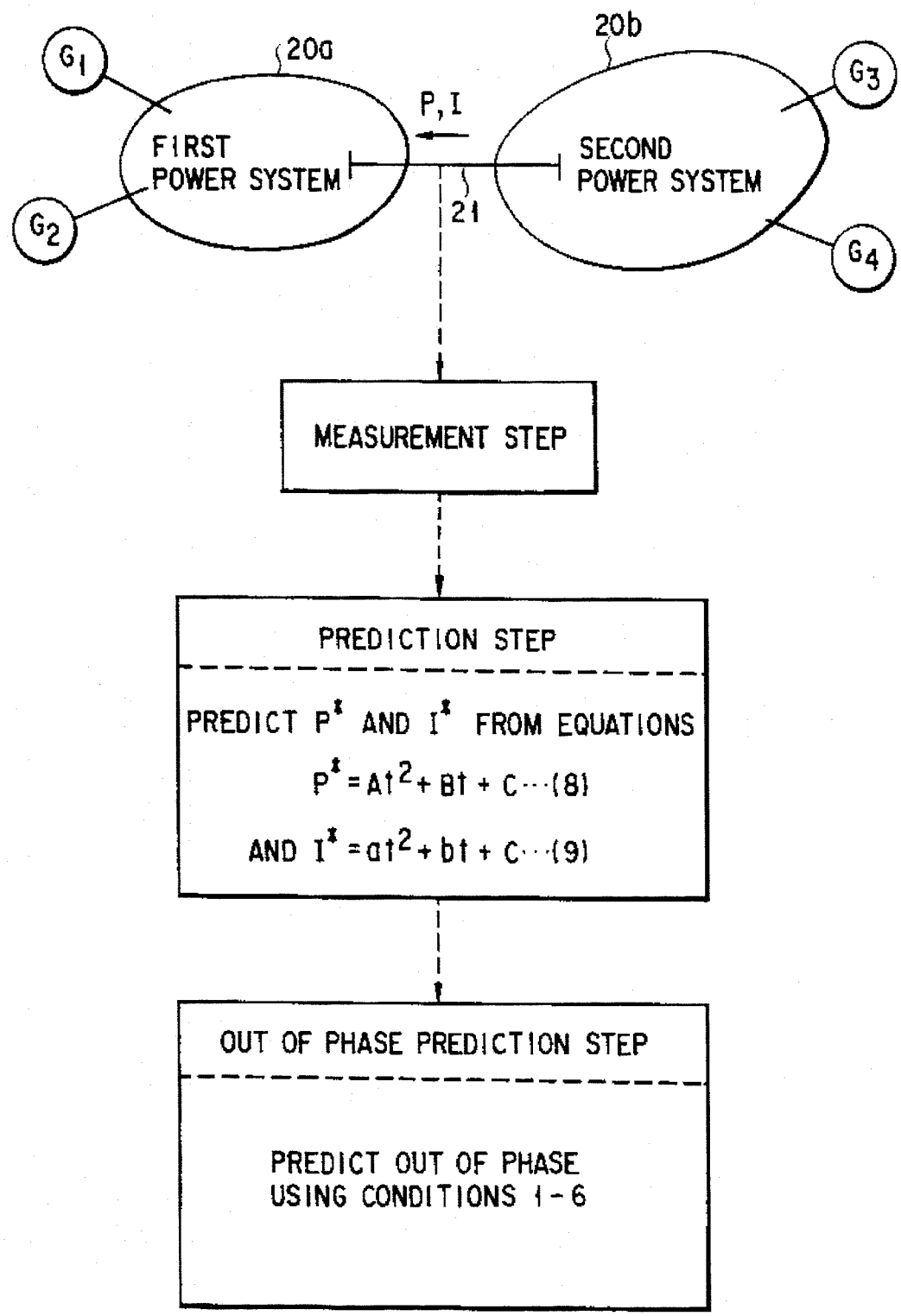
F I G. 3

OSCILLATIONS OF
STABLE GENERATORS

OSCILLATIONS OF
UNSTABLE GENERATORS
(OUT OF PHASE CONDITION)

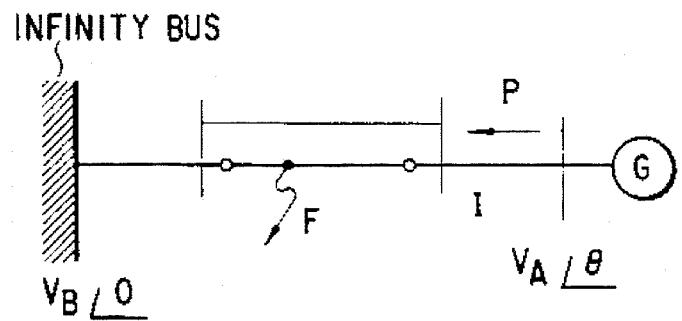
F I G. 7
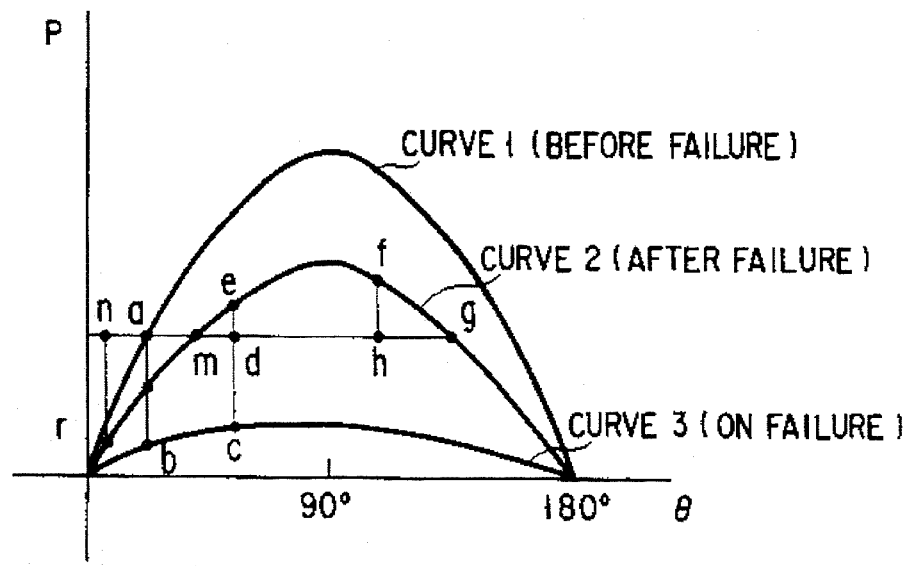
F I G. 8A
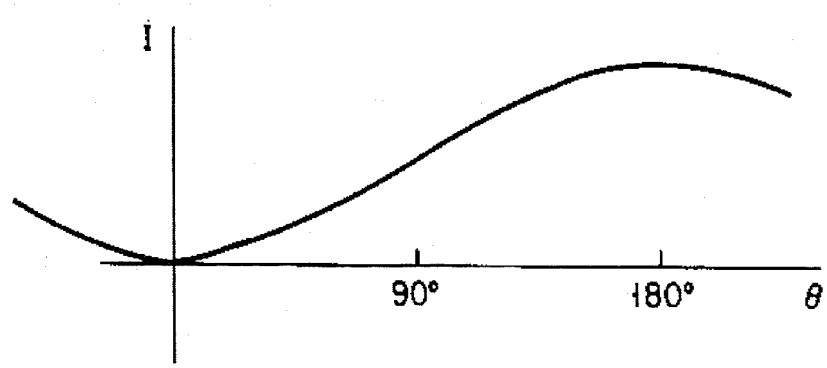
F I G. 8B

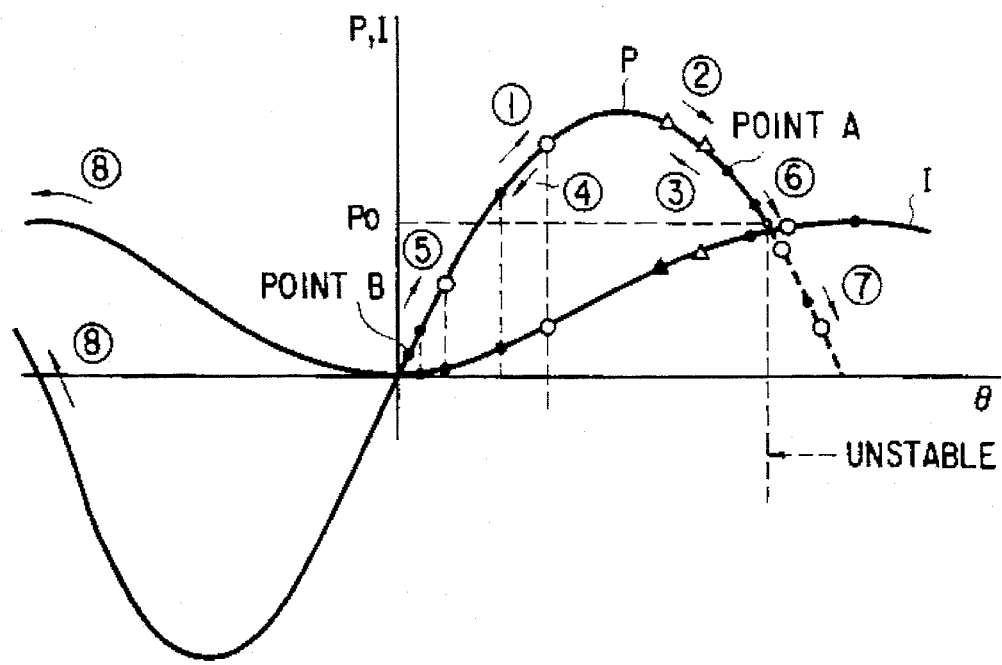
F I G. 9
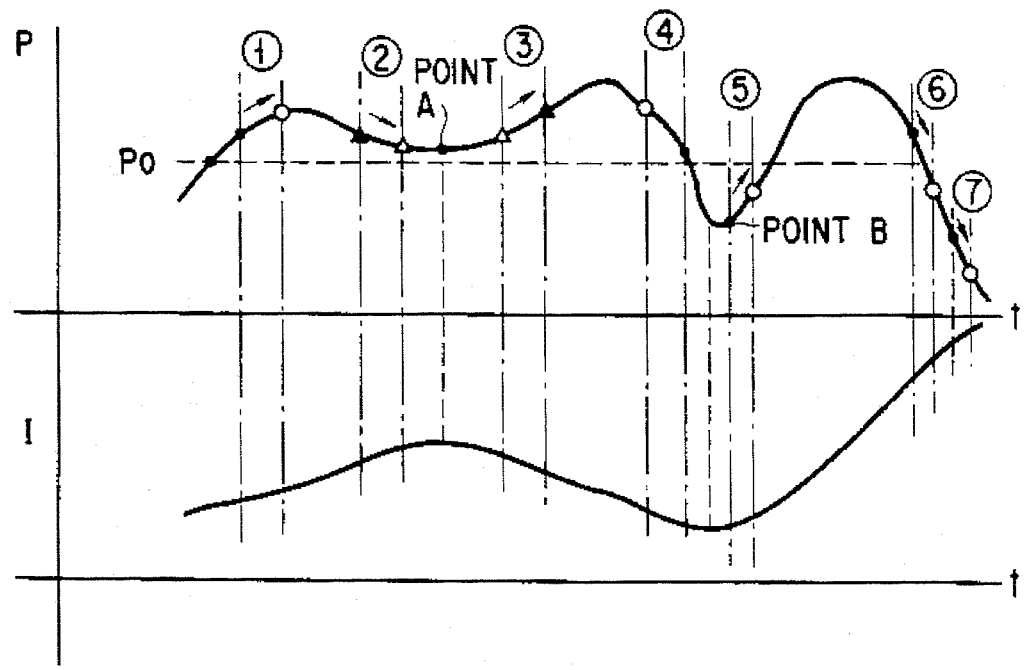
F I G. 10

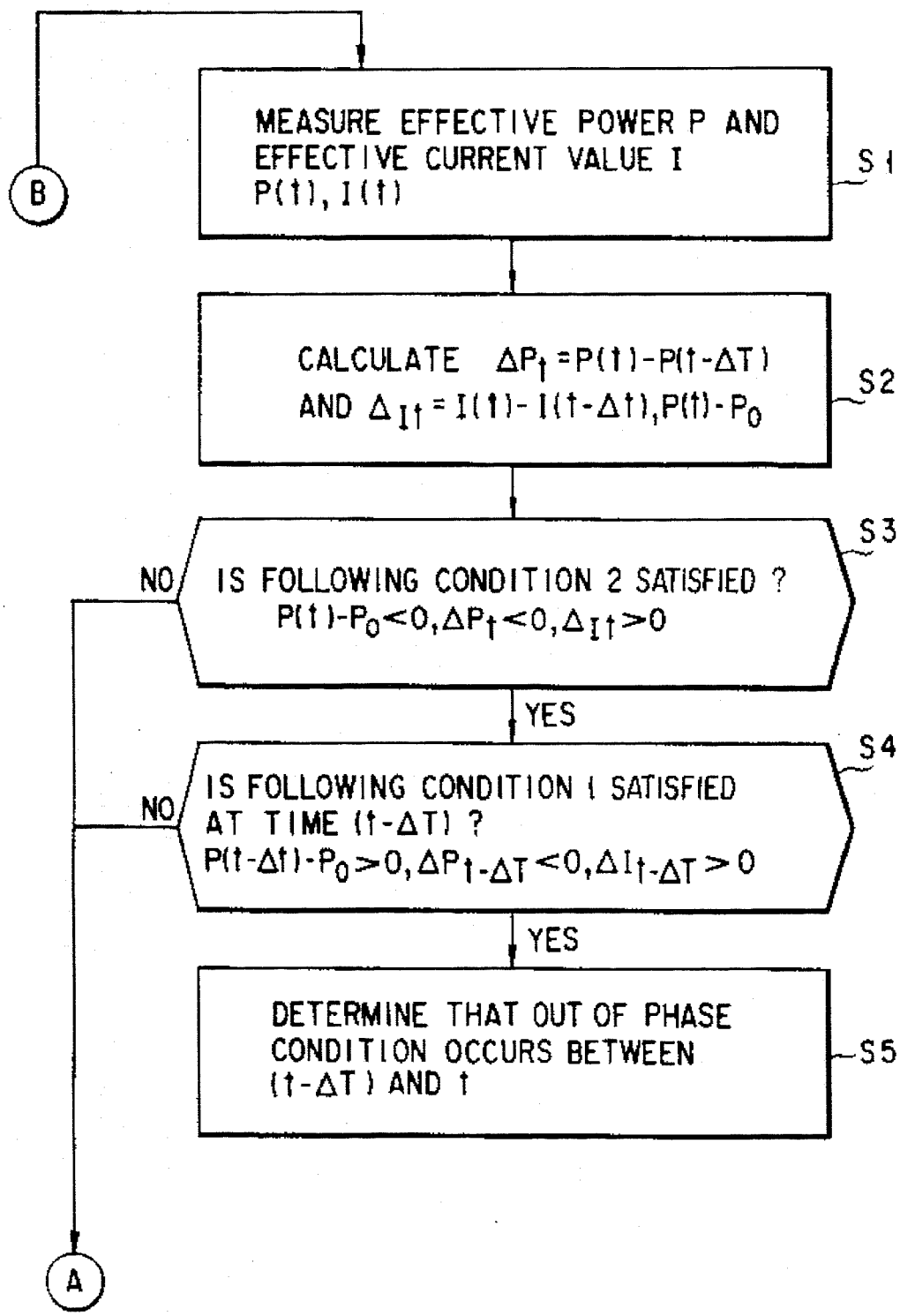
F I G. 15A

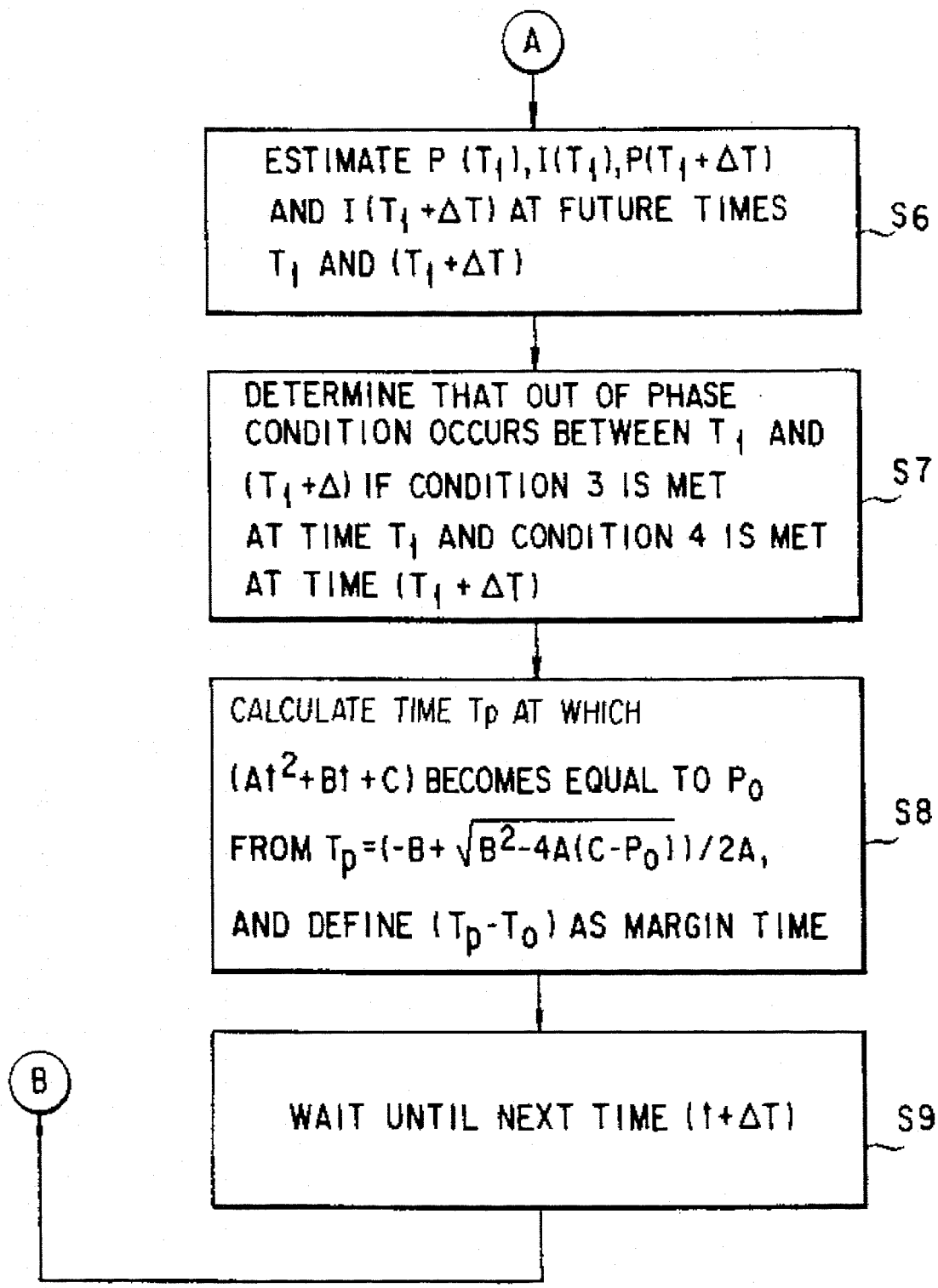
F I G. 15B

APPARATUS FOR DETECTING OUT OF PHASE OF POWER SYSTEMS AND METHOD FOR DETECTING THE SAME

BACKGROUND OF THE INVENTION

1. Field of the Invention

The present invention relates to an apparatus and a method for detecting an out of phase (loss of synchronism) occurring in power systems according to the power, current, and the like measured at a tie point between the power systems and, more specifically, to an apparatus for stabilizing power systems by detecting or predicting an out of phase occurring in the power systems and paralleling off a tie point between the power systems. The present invention is intended to detect and predict the first swing instability to the multi-swing instability.

2. Description of the Related Art

Oscillation of generator output power occurs in a power system because of various factors such as variations in load and a system accident. Small oscillation of generator output power occurs even when the power system is in a normal state. If, however, the oscillation of generator output power increases, it causes an out of phase condition finally, with the result that the entire power system is likely to collapse if the out of phase condition is not removed.

Conventionally, the oscillation of general output power respect to an electric parameter in the power system has been detected by various methods in order to predict or detect an out of phase condition appearing in the power system. For example, Jpn. Pat. Appln. KOKOKU Publication No. 4-52051 discloses an out of phase prediction apparatus. In this apparatus, a bus voltage and a line current are sampled at a constant cycle in any one of electric-power stations, substation, etc., connected together through transmission lines. A bus voltage and a current vector are detected from the sampled bus voltage and line current, and a bus voltage vector of another station is determined based on the detected value and vector. Then differences in phase angle among the stations are calculated from the real and imaginary parts of the bus voltage vector, and a difference in voltage phase angle is predicted from the calculated differences in phase angle, thereby predicting that an out of phase will occur in the power system based on variations in the difference in voltage phase angle.

Jpn. Pat. Appln. KOKOKU Publication No. 4-65618 teaches an out of phase detection apparatus. In this apparatus, the current and voltage of a power system are sampled at a predetermined cycle, and electric power is obtained from the sampled current and voltage. The out of phase of the power system is then detected from variations in the electric power with time. Moreover, instantaneous power at the present time is obtained from the sampled current and voltage, and it is determined from variations in the instantaneous power with time whether the oscillation of out of phase increases or decreases.

According to the conventional methods described above, a threshold value suitable for determining an out of phase is preset by simulation, and it is determined whether the out of phase occurs or not, according to whether a detected or predicted phase angle exceeds the preset threshold value.

Since, however, the configuration of the power system is changed frequently, the suitable threshold value changes, and the threshold value has to be reset accordingly.

SUMMARY OF THE INVENTION

The present invention has been made in consideration of the above situation, and its object is to provide an apparatus for stabilizing power systems which is capable of detecting an out of phase condition without using any threshold value and does not have to perform an operation of changing a threshold value and the like in accordance with a change in the power systems.

According to one aspect of the present invention, there is provided an apparatus and a method for detecting an out of phase in which an effective power and an effective current are measured at a tie point of the power systems to obtain their effective values P and I, and an amount of variations of the values obtained when the systems are in a steady state and are oscillating, is detected, thereby determining whether an out of phase has occurred. Thus, the out of phase can be detected from the trends of electric parameter of the power systems, without using the optimum threshold value according to the configuration of the power systems.

According to another aspect of the present invention, there is provided an apparatus and a method for detecting an out of phase in which a power and a current at the near future time are predicted from a trend of the measured effective power and current with time, thereby predicting that an out of phase will occur based on the predicted values. Therefore, the out of phase can be predicted from a trend of relative variations in electric parameter of the power systems, without using the optimum threshold value according to the configuration of the power systems.

According to still another aspect of the present invention, there is provided an apparatus and a method for detecting an out of phase in which variations in power and current at the near future time are predicted as time functions from a trend of variations in the measured effective power and current with time, thereby determining whether an out of phase will occur and, when it is determined that the out of phase will occur, estimating a time (out of phase margin time) required until the out of phase occurs. Thus, the time (out of phase margin time) can be estimated correctly, and effective information for stabilizing the power systems can be acquired.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

FIG. 3 is a schematic view showing a method for predicting an out of phase condition of the power systems by the stabilizing apparatus of FIG. 1;

FIG. 7 is a systematic diagram of the infinity bus of one generator;

FIG. 8A is graph of P-θ curves representing a case where no failure has occurred yet, a case where a failure is eliminated, and a case where a failure occurs;

FIG. 8B is a graph showing an I-θ curve;

FIG. 9 is a graph showing a relationship between variations in P and stability θ and between variations in I and stability θ;

FIG. 10 is a graph showing a relationship between variations in P and time t and between variations in I and time t;

FIGS. 15A and 15B show a flowchart of an operation of the out of phase detecting apparatus according to an embodiment of the present invention.

DETAILED DESCRIPTION OF THE PREFERRED EMBODIMENT

An embodiment of the present invention will now be described, with reference to the accompanying drawings.

Figure 1:
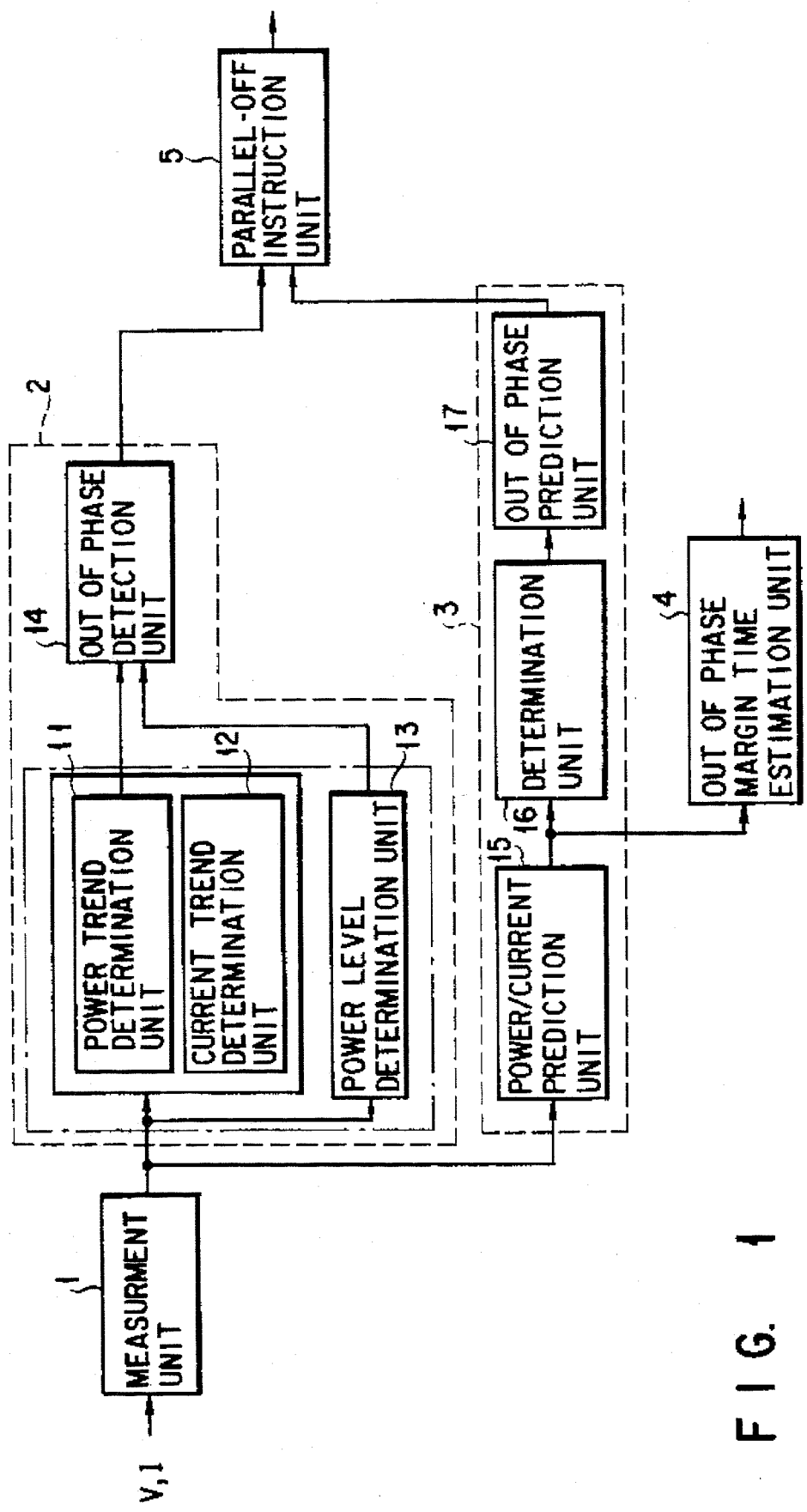
FIG. 1 is a block diagram showing a function of an apparatus for stabilizing power systems, to which an out of phase detecting apparatus according to the present invention is applied.

FIG. 1 is a block diagram showing a function of an apparatus for stabilizing power systems, to which an out of phase detecting apparatus according to the present invention is applied. As shown in FIG. 1, the stabilizing apparatus includes a measurement unit 1 for measuring various electric parameter of the power systems (effective power P and current effective value I of an interconnection tie of the power systems) at a tie point of the transmission line, an out of phase determination block 2 for detecting an out of phase condition appearing on the power systems from a measurement result of the measurement unit 1, an out of phase prediction block 3 for predicting whether an out of phase condition will appear on the power systems from the measurement result of the measurement unit 1, an out of phase margin time estimation unit 4 for estimating a margin time required until an out of phase condition occurs on the power systems, and a parallel-off instruction unit 5 for giving an instruction for parallel-off when the out of phase is detected in the block 2 or predicted in the block 3.

The measurement unit 1 receives a current and a voltage at a constant cycle from a current transformer CT and a potential transformer PT arranged on the interconnection tie of the power systems, and measures the effective power P and current effective value I of the interconnection tie.

The out of phase determination block 2 is connected to the measurement unit 1 in order to receive the effective power P and current effective value I therefrom. The block 2 includes a power trend determination unit 11, a current trend determination unit 12, a power level determination unit 13, and an out of phase detection unit 14. The unit 11 subtracts effective power $P(t-\Delta t)$ measured at time $(t-\Delta t)$ from effective power $P(t)$ measured at time t, and outputs a power trend determination signal representing the polarity of a value $\Delta P$ obtained from the subtraction. The unit 12 subtracts current effective value $I(t-\Delta t)$ measured at time $(t-\Delta t)$ from current effective value $I(t)$ measured at time t, and outputs a current trend determination signal indicating the polarity of a value $\Delta I$ obtained from the subtraction. The unit 13, in which a steady effective power $P_0$) measured when the power systems are in a steady state is stored previously, subtracts the steady effective power $P_0$) from the effective power $P(t)$ and outputs a power determination signal representing the polarity of a value $(P(t)-P_0)$ ) obtained from the subtraction. The unit 14 stores a combination pattern of the polarities of $(P-P_0)$ ),$\Delta P$, and $\Delta I$ shown in FIGS. 11 and 12, and determines a direction in which an operating point shifts on the curves of FIGS. 11 and 12, based on a direction in which the combination pattern changes. The unit 14 also stores the steady effective power $P_0$) and always determines whether the maximum value of oscillating effective power P is larger than the steady effective power $P_0$. The unit 14 thus determines whether an out of phase condition occurs by applying the shift direction of the operating point, the relationship between the maximum value of effective power P and steady effective power $P_0$, the power trend determination signal, the current trend determination signal, and the power determination signal to the determination conditions (to be described later).

The out of phase prediction block 3 is connected to the measurement unit 1 in order to receive the effective power P and current effective value I therefrom. The block 3 includes a power/current prediction unit 15, a determination unit 16, and an out of phase prediction unit 17. The unit 15 predicts effective power $P(T)$ and $P(T+\Delta T)$, and current effective value $I(T)$ and $I(T+\Delta T)$, which are measured at the future times T and $(T+\Delta T)$, based on the trend of effective power and current effective value. The unit 16 includes a power trend determination unit, a current trend determination unit, and a power level determination unit, as the out of phase determination block 2 does. These determination units determine the trend of the effective power $P(T+\Delta T)$ and current effective value $I(T+\Delta T)$ at the future time $(T+\Delta T)$ and the relationship between steady effective power $P_0$) and effective power $P(T+\Delta T)$, and output a power trend determination signal, a current trend determination signal, and a power determination signal at the future time $(T+\Delta T)$. The unit 17 stores a combination pattern of the polarities of $(P-P_0)$,$\Delta P$, and $\Delta I$ shown in FIGS. 11 and 12, and determines a direction in which an operating point shifts on the curves of FIGS. 11 and 12 at the future time $(T+\Delta T)$, based on a direction in which the combination pattern changes. The unit 17 also stores the steady effective power $P_0$) and always determines whether the maximum value of effective power P is larger than the steady effective power $P_0$. The unit 17 thus determines whether an out of phase condition will occur in the near future by applying the shift direction of the operating point, the relationship between the maximum value of effective power P and steady effective power $P_0$, the power trend determination signal at the future time $(T+\Delta T)$, the current trend determination signal, and the power determination signal indicating a relationship between $P(T+\Delta T)$) and $P_0$) to the determination conditions (to be described later).

The out of phase margin time estimation unit 4 calculates a time required until an out of phase occurs, by the method (to be described later) based on the coefficients of prediction formulae for the power and current in the near future which are predicted by the power/current prediction unit 15.

The parallel-off instruction unit 5 opens a circuit breaker of a predetermined transmission line between the power systems when the out of phase detection unit 14 detects an out of phase or the out of phase prediction unit 17 predicts it.

The principles of detecting and predicting an out of phase will now be described.

Figure 6A:
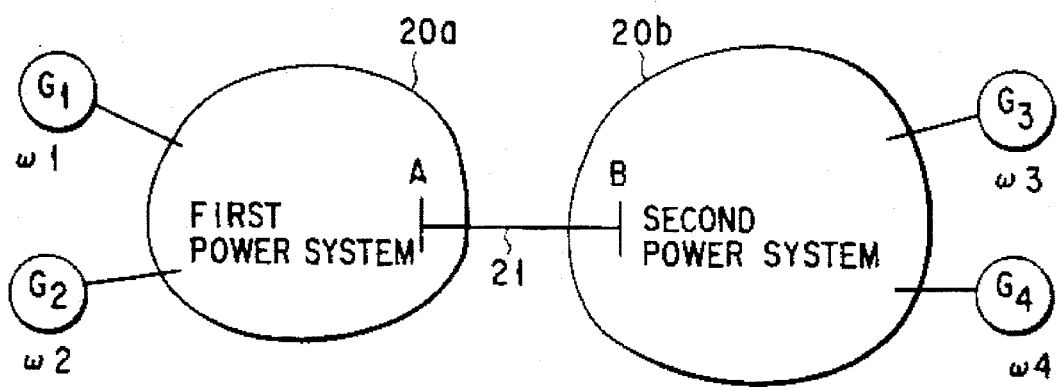
FIG. 6A is a view showing an arrangement of the power systems and generators included in the power systems.
Figure 6B:
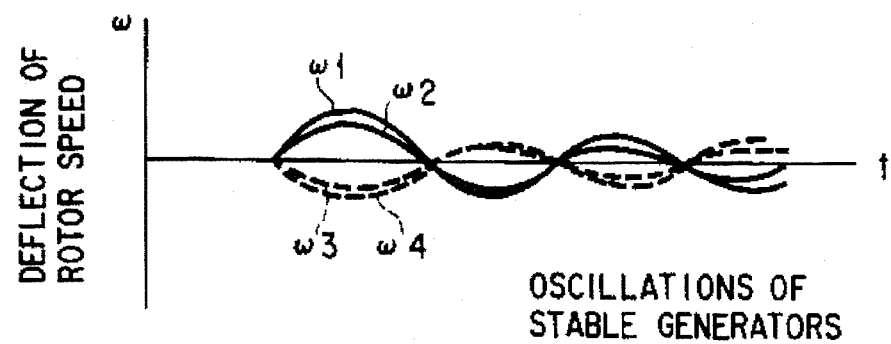
FIG. 6B is a view showing oscillations of the generators when the power systems of FIG. 6A are stable.
Figure 6C:
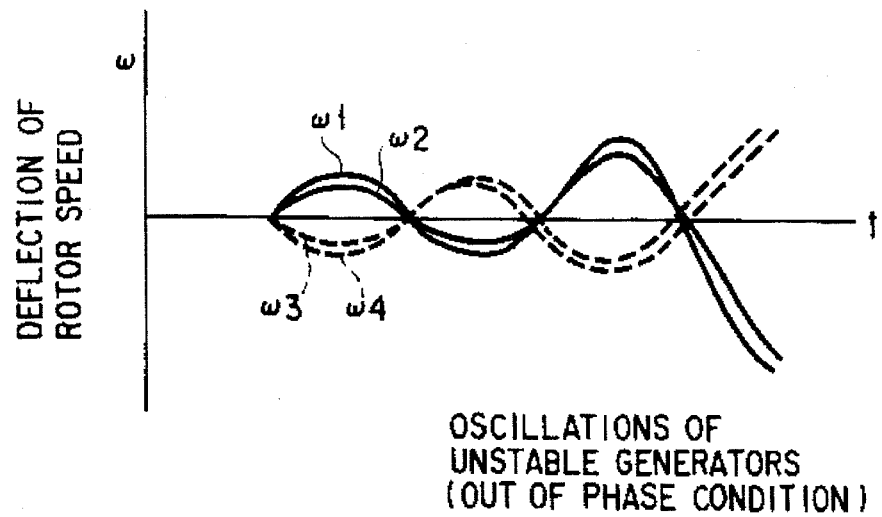
FIG. 6C is a view showing oscillations of the generators when the power systems of FIG. 6A are unstable.

As shown in FIG. 6A, the first and second power systems 20a and 20b are connected by an interconnection tie 21, and the first power system 20a includes a first group of generators G1 and G2, and the second power system 20b includes a second group of generators G3 and G4. If the oscillations of the generators G1 and G2 are represented by $\omega_1$ and $\omega_2$, respectively, and those of the generators G3 and G4 are represented by $\omega_3$ and $\omega_4$, respectively, the first and second groups of generators oscillate while the oscillations are attenuated as shown in FIG. 6B or they oscillate so that the oscillations diverge (become unstable) from each other as shown in FIG. 6C. When the oscillations of generator output power systems diverge and finally no synchronism can be maintained between the first and second groups of generators, the interconnection tie 21 has to be paralleled off to eliminate the divergence of the oscillations. Note that "$\omega$" shown in FIGS. 6B and 6C indicates a deflection (or deviation) from the rated value of the revolution speed of the generators (for example, 50) rps of the 50) Hz system and 60) rps of the 60) Hz system).

First, the oscillation phenomena of the two groups of generators, as shown in FIGS. 6A to 6C, will be described, with reference to the infinity bus of one generator shown in FIG. 7.

Assume that the voltage of the infinity bus is $V_B \angle 0$, the voltage of the generator G is $V_A \angle \theta$, the impedance of a transmission line (interconnection tie) is jX, the power supplied from a generator G into a power system is P, and the current effective value is I.

I. Relationship between P, I and $\theta$ $$P+jQ=V_A \cdot \overline{I} \quad (1)$$

$$I(V_A \angle \theta - V_B)/jX \quad (2)$$

$$P=(V_A \cdot V_B \sin\theta)/X \quad (3)$$

The following approximation is performed for simple description of the oscillation phenomena. The approximation does not adversely affect the generality of the phenomena.

Since the voltages are close to the rated value in the oscillation phenomena appearing between the power systems, they can approximate 1.0) as follows.

$$V_A=V_B=1.0$$

$$I=(1/X)\sin\theta+(1/X)j(1-\cos\theta) \quad (4)$$

Thus the effective value I is given by the following equation.

$$I=(1/X)(2-2\cos\theta)^{1/2} \quad (5)$$

The above equations (3) and (5) represent a relationship between $\theta$ and P and a relationship between $\theta$ and I, respectively. FIG. 8A shows a relationship between P and $\theta$, and FIG. 8B shows a relationship between I and $\theta$.

The characteristics of these relationships shown in FIGS. 8A and 8B are as follows. As $\theta$ increases from 0, P increases and reaches a maximum value when $\theta$ is 90°). If 74 exceeds 90°), the power P decreases. The value I increases as 74 increases from 0) to 180°.

II. Relationship between P and Stability and between 74 and Stability

In the power system having one generator as shown in FIG. 7, the impedance of the system varies with respective cases where no failure has occurred yet, a failure (short circuit) occurs, and the failure has been eliminated. Therefore, as shown in FIG. 8A, a P-$\theta$ curve can be represented as curves 1, 2 and 3 for the three cases. The same is true of the power system having two generators.

If an output of the generator is $P_0$) in the case where no failure has occurred yet, the operating point is indicated by a on the curve 1. When a failure occurs, the operating point shifts to b and varies on the curve 3 in accordance with the oscillation of generator output power system. If the failure is eliminated at c on the curve 3, the operating point shifts to e on the curve 2. Then it shifts from e to f on the curve 2.

If a point f is determined so that an area "abcd" and an area "defh" are equal to each other, the operating point shifts from f to r on the curve 2. The point r is located so that an area "mfh" and an area "mnr" are equal to each other. As a result, the operating point moves (or oscillates) between f and r on the curve 2. In the actual power system, the operating point moves on the curve 2 and finally arrives at a point m since the oscillations of a number of generators affect one another, or a brake effect is produced due to a loss of the transmission line or by energization units of the generators. The operating point may also move beyond g on the curve 2, resulting in an out of phase (loss of synchronism). It is when an area "abcd" and an area "deg" are equal to each other that the stability of the power system attains at its limitation. If the area "abcd" is larger than the area "deg", the operating point shifts to the right of g of the curve 2 in FIG. 8A, and an out of phase occurs in the generator. In other words, if the operating point is located on the left of g in FIG. 8A, and the system is in a stable state or the system is at least not unstable yet. On the contrary, if the operating point is located on the right of g, the system becomes unstable. The stability of the system is determined based on variations in p and I with time and a relationship between $P_0$) and P during the oscillation.

The relationship between I and 74 is expressed by the above equation (5) and shown in FIG. 8B.

III. Relationship between Variations in P and I with Time and Stability

The above I and II are applied to the generally-used power systems each having a group of generators G, as shown in FIG. 6A. FIG. 9 shows a relationship between P and 74 and between I and $\theta$, and FIG. 10 shows variations in P and I with time t. The oscillation will be described with reference to these figures. As time elapses, the operating point passes ① and ②, and reaches a point A on the P-$\theta$ curve of FIG. 9. Then it shifts to the left while passing ③ and ④, and reaches a point B. Then it shifts to the right and passes ⑤, ①, ②, ⑥, and ⑦. In this case, P and I vary with time as shown in FIG. 10.

The relationship between the state and stability of the power system will now be described, with reference to FIGS. 9 and 10.

It is apparent from FIG. 9 that the power system is unstable if the operating point is located on a dotted line of the P-$\theta$ curve. It is also apparent that the power system is stable or is likely to be unstable as time passes, if the operating point is located in a real line of the curve. It is therefore possible to determine, from the location of the operating point on the P-θ curve, whether the power system is stable or unstable. Furthermore, the stability of the power system can be determined from the variations in P and I, as follows.

(i) In the direction of arrow ① of FIG. 9, both P and I increase and, in this case, the system is stable. This state is indicated by ① of the time chart in FIG. 10.

(ii) In the direction of arrow ② of FIG. 9, P decreases and I increases, and P is larger than $P_0$. It cannot be determined yet that the system is unstable. This condition is denoted by ② of the time chart in FIG. 10.

(iii) In the direction of arrow ③ of FIG. 9, P increases and I decreases and, in this case, the system is unstable. This state is indicated by ③ of the time chart in FIG. 10.

(iv) In the direction of arrow ④ of FIG. 9, both P and I decrease, and the system is stable.

(v) In the direction of arrow ⑥ of FIG. 9, P decreases and I increases, and P is smaller than $P_0$. It can be determined that an out of phase occurs in the generators at this time. The variations of P and I are represented by ⑥ of the time chart in FIG. 10.

(vi) In the direction of arrow ⑦ of FIG. 9, P decreases and I increases. If this state appears after (v), it can be determined that the out of phase has occurred in the generators.

(vii) The power P can be oscillated in the negative direction. If, in this case, P changes from negative to positive and I decreases, then an out of phase occurs in the generators since the phase angles of the two groups of generators are shifted about 180°) from each other. This state is denoted by ⑧ of the time chart in FIG. 9.

Whether the power system changes from its stable state to its out of phase condition can be detected by determining, using measured values of P and I, whether the following conditions are satisfied. Note that 74 is a difference in phase between the two groups of generators and a transmission line is needed to use it. Thus, in this embodiment, the state of the power system is detected only by using P and I which can be measured on the transmission line.

Assume that a measurement time interval is ΔT and the present time is t, the past time $t_1$ is (t−ΔT), which is a predetermined time Δt before the time t. The amounts of variations ΔP and ΔI from $t_1$ to t are calculated from values P(t), P($t_1$), I(t), and I($t_1$) measured at the present time t and past time $t_1$, as follows.

$$\Delta P = P(t) - P(t_1) \quad (6)$$

$$\Delta I = I(t) - P(t_1) \quad (7)$$

The relationship between variations in P and I and stability of the power system, and the determination logic will now be described, with reference to FIGS. 11 and 12.

Figure 11:
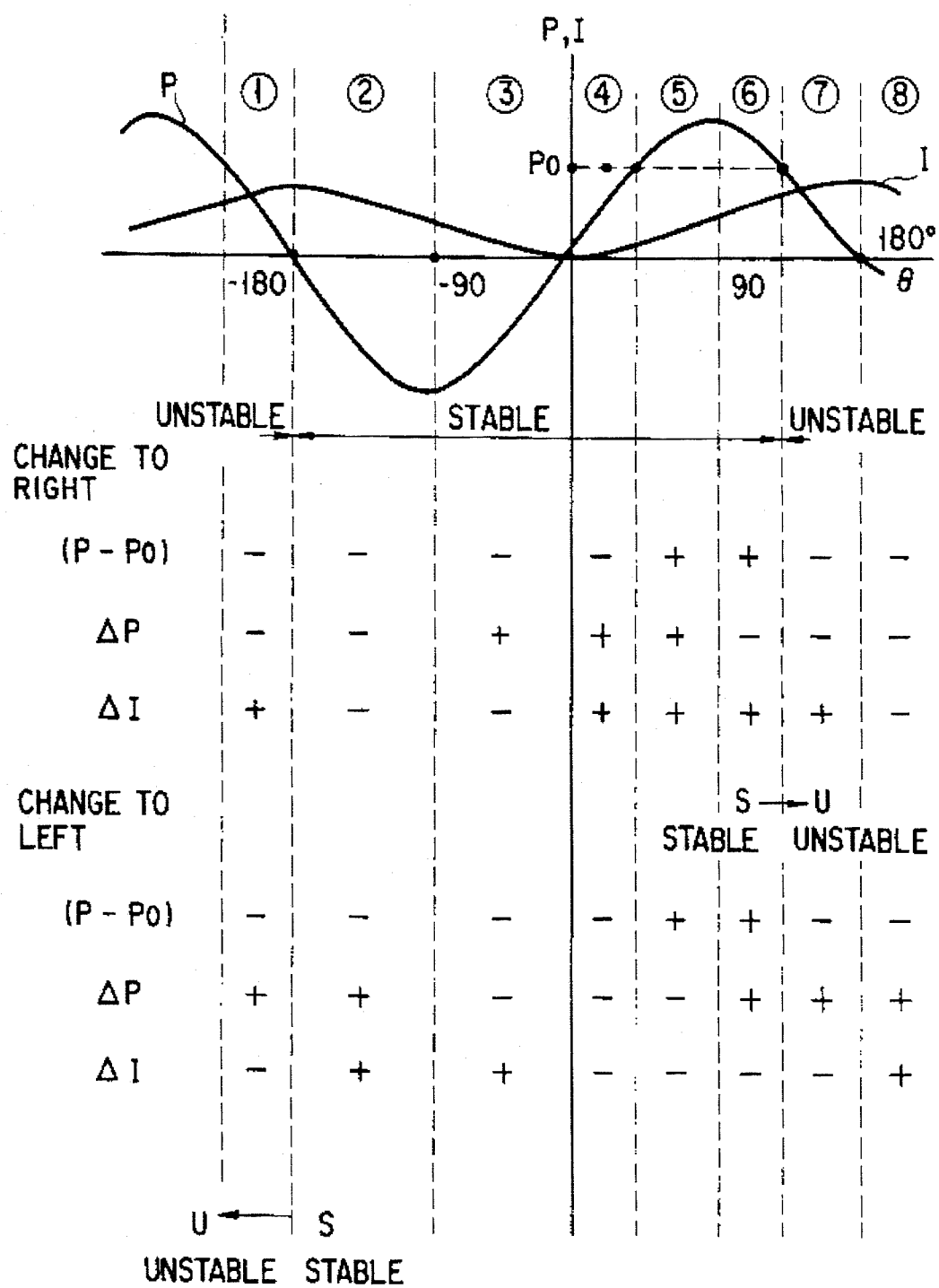
FIG. 11 is a diagram showing a relationship between variations in P and the stability and a relationship between variations in I and the stability when $P > P_0$.

FIG. 11 depicts the relationship between variations in P and I and stability of the power system. In this figure, the power measured in the steady-state system is represented by $P_0$. The power $P_0$ is considered to be positive in the following descriptions. If $P_0$ is negative, it is multiplied by (−1) and, in this case, the measured negative values of P(t) are multiplied by (−1) accordingly.

(i) The operating point moves to the right on the curve:

If the operating point is located within a range indicated by ④ of FIG. 11, $$(P-P_0)<0, \Delta P>, \Delta I>0.$$

If the operating point is located within a range indicated by ⑤ of FIG. 11, $$(P-P_0)>0, \Delta P>, \Delta I>0.$$

As described above, the power system changes from the stable state to unstable state when the operating point shifts from ⑥ to ⑥ D in FIG. 11.

More specifically, if the following condition 1 is met at time (t−Δt) and the following condition 2 is met at the next time t, it can be determined that an out of phase has occurred in the power system between time (t−Δt) and time t.

$$(P-P_0)>0, \Delta P>0, \Delta I>0. \quad \text{(condition 1)}$$

where P=P(t−Δt), ΔP=P(t−Δt)−P(t−2Δt), ΔI=I(t−Δt)−I(t−2Δt).

$$(P-P_0)<0, \Delta P>0, \Delta I>0 \quad \text{(condition 2)}$$

where P=P(t), ΔP=P(t)−P(t−Δt), ΔI=I(t)−I(t−Δt).

(ii) The operating point moves to the left on the curve:

When the operating point shifts from ② to ① in FIG. 11, a difference in phase angle between the generators is 180°) or more. It can thus be determined that an out of phase occurs in the generators.

Furthermore, if the following condition 3 is met at time (t−Δt) and the following condition 4 is met at the next time t, it can be determined that an out of phase condition has appeared in the power system between time (t−Δt) and time t.

$$(P-P_0)<0, \Delta P>0, \Delta I>0 \quad \text{(condition 3)}$$

where P=P(t−Δt), ΔP=P(t−Δt)−P(t−2Δt), ΔI=I(t−Δt)−I(t−2Δt).

$$(P-P_0)<0, \Delta P>0, \Delta I<0 \quad \text{(condition 4)}$$

where P=P(t), ΔP=P(t)−P(t−Δt), Δ=I(t)−IΔt).

Figure 12:
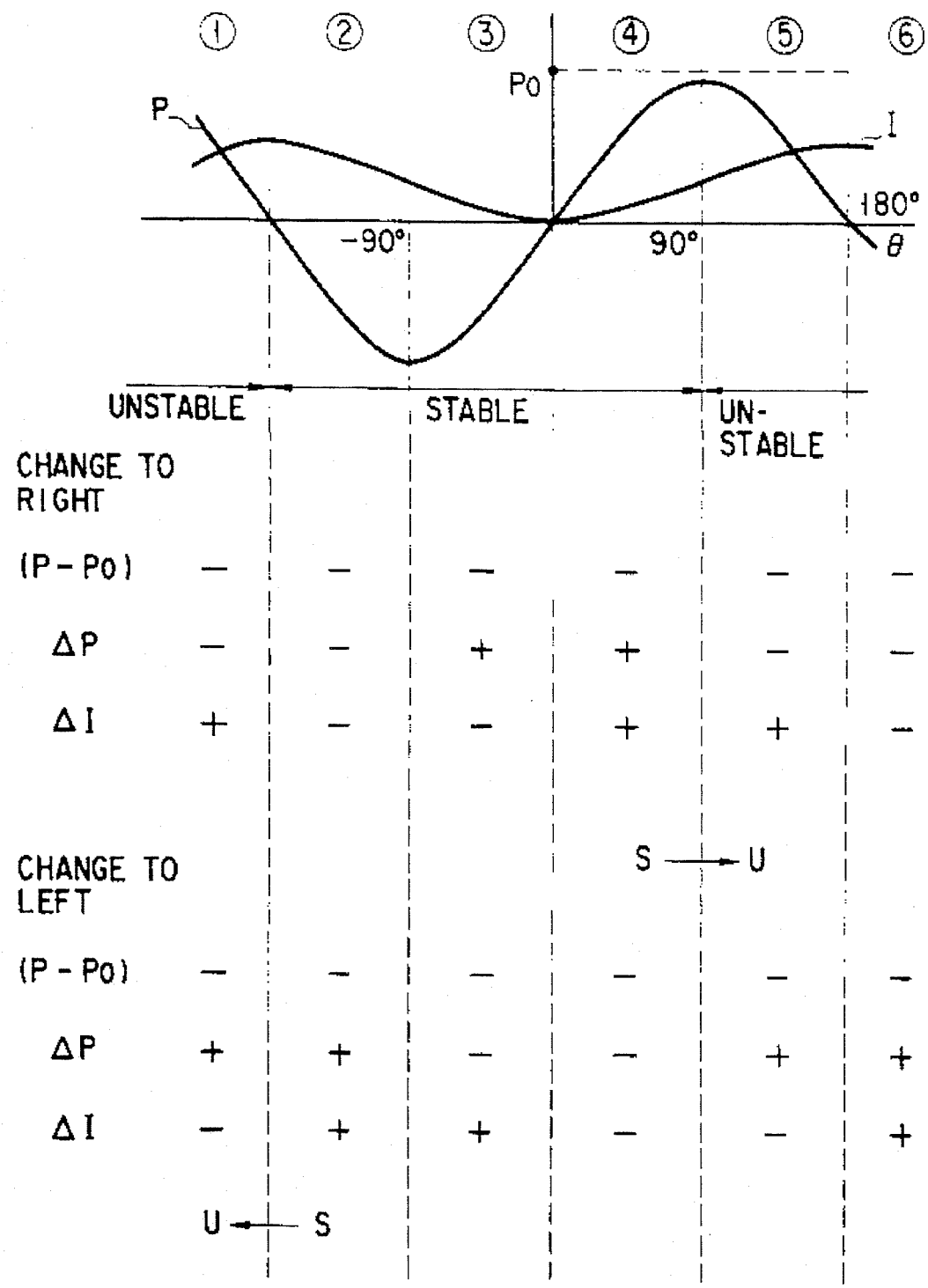
FIG. 12 is a diagram showing a relationship between variations in P and the stability and a relationship between variations in I and the stability when $P < P_0$.

(iii) When the operating point shifts to the right on the curve, if the oscillating power is not restored to a value higher than the steady-state power $P_0$, it can be determined that an out of phase occurs in the power system at the time when the operating point shifts from range ④ to range ⑤ in FIG. 12.

FIG. 12 shows the relationship between the variations in P and I and the stability of the power system when the oscillating power P is not higher than the steady power $P_0$.

Moreover, if the following condition 5 is met at time (t−Δt) and the following condition 6 is met at the next time t, and if the power P is not restored to a value higher than the steady effective power $P_0$, it can be determined that an out of phase condition has occurred in the power system between time (t−Δt) and time t.

$$(P-P_0)<0, \Delta P>0, \Delta I>0 \quad \text{(condition 5)}$$

where P=P(t−Δt), ΔP=P(t−Δt)−P(t−2Δt), ΔI=I(t−Δt)−I(t−2Δt).

$$(P-P_0)<0, \Delta P<0, \Delta I>0 \quad \text{(condition 6)}$$

where P=P(t), ΔP=P(t)−P(t−Δt), ΔI=I(t)−I(t−Δt).

The above conditions 1 to 6 are determined by the out of phase detection unit 14.

A method for calculating predicted values of P and I at the future time, will now be described.

The out of phase is predicted early by predicting P and I at the near future time from the measured values of P and I of the transmission line. As shown below, an equation (8) for prediction of P can be obtained from the curves of effective power shown in FIGS. 13 and 14A, and an equation (9) for prediction of I can be obtained from the curve of current effective value shown in FIG. 14B. Coefficients A, B, C, a, b, and c of equations (8) and (9) are determined so that they optimumly coincide with values $P_1, P_2, \ldots, P_{n+1}$ and $I_1, I_2, \ldots, I_{n+1}$ which are measured at intervals $\Delta T$.

$$P(t)=At^2+Bt+C \tag{8}$$

$$I(t)=at^2+bt+c \tag{9}$$

The time at which the values of $P_1$ or $I_1$ are measured, is defined as a starting point (t=0) t. For example, the least square method is used as a method of mathematically determining the coefficients. In this embodiment, the effective power P and current effective value I are represented by a quadratic function; however, either a linear or quadratic function can be used. Since the cycle of the oscillation of generator output power system is every several seconds (e.g., 2 or 3 seconds), the interval $\Delta T$ is about 0.05 to 0.1 second, and the number n of measured values to be used need five to six samples or more. The prediction time for P and I, which depends upon the power system, is 0.2 to 1 second ahead of the present time.

As described above, the coefficients of equations (8) and (9) are determined from the last n measured values. An effective power $P^*$ and a current effective value $I^*$ at each of future times $T_1$ and $(T_1+\Delta T)$ can be predicted by substituting the coefficients for the equations (8) and (9).

This prediction is performed by the power/current prediction unit 15.

If variations $\Delta P$ and $\Delta I$ in both power and current from $T_1$ to $(T_1+\Delta T)$, and $(P-P_0)$ ) are calculated, and the above conditions 1 to 6 are judged therefrom, it can be determined whether an out of phase condition will occur between $T_1$ and $(T_1+\Delta T)$.

An operation of the out of phase detecting apparatus so constructed, will now be described.

Figure 2:
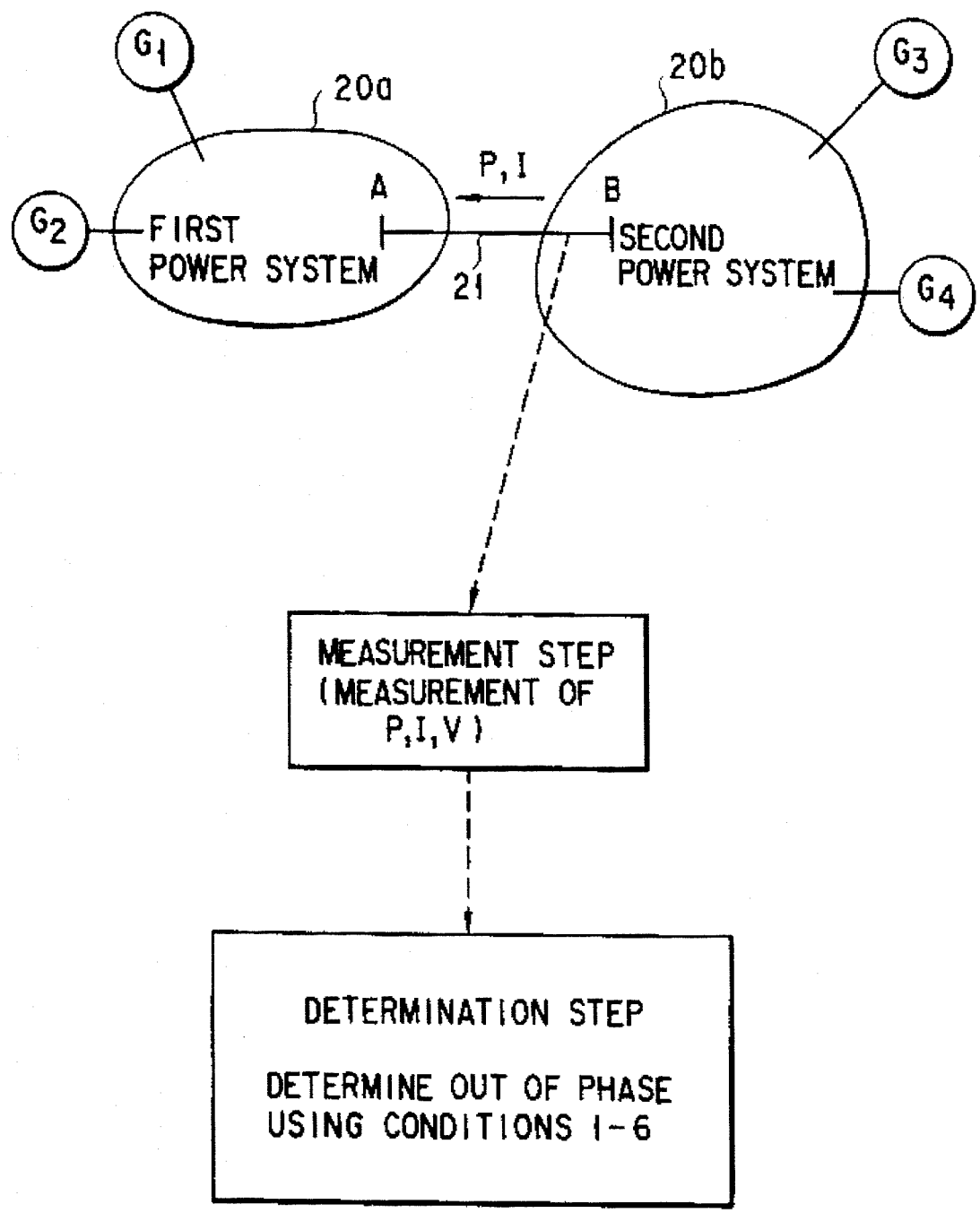
FIG. 2 is a schematic view showing a method for detecting an out of phase condition of the power systems by the stabilizing apparatus of FIG. 1.

FIG. 2 is a schematic diagram showing a process of detecting an out of phase by the out of phase determination block 2. The voltage and current of the interconnection tie 21 of the power systems are detected by the potential transformer PT and current transformer CT, and then input to the measurement unit 1. In the measurement unit 1, effective power P and current effective value I are measured at a constant cycle based on the voltage and current of the interconnection tie 21, and then supplied to the determination units 11 to 13. The power trend determination unit 11 outputs power trend determination signals according to effective power P(t) at the present time t and effective power $P(t-\Delta t)$ at the past time $(t-\Delta)$ which is a predetermined time $\Delta t$ before the present time. The current trend determination unit 12 outputs current trend determination signals according to current effective value I(t) at the present time t and current effective value $I(t-\Delta t)$ at the past time $(t-\Delta t)$. The power level determination unit 13 outputs power determination signals according to effective power P(t) at the present time t and steady power $P_0$.

The out of phase detection unit 14 always determines in which direction the operating point moves, from combination patterns of polarities of the power trend determination signals, current trend determination signals, and power determination signals, and monitors whether the maximum value of the effective power exceeds the steady power $P_0$) when power systems are in the steady state. If any one of sets of conditions 1 and 2, conditions 3 and 4, and conditions 5 and 6 is satisfied, the unit 14 outputs an out of phase detection signal to the parallel-off instruction unit 5.

FIG. 3 is a schematic diagram showing a process of predicting an out of phase by the out of phase prediction block 3. The measurement unit 1 measures effective power P and current effective value I at a constant cycle, and the measured values are input to the voltage/current prediction unit 15 at a constant cycle. Whenever the voltage/current prediction unit 15 receives the measured values from the measurement unit 1, it determines the coefficients of the equations (8) and (9) so that they optimumly coincide with the last n measured values the most suitably. Then, effective power P(T) and current effective value I(T) at the future time T are predicted from the equations (8) and (9), and effective power $P(T+\Delta T)$ and current effective value $I(T+\Delta T)$ at the future time $(T+\Delta T)$ are predicted. The effective power $P^*$ and current effective value $I^*$ so predicted are supplied to the determination unit 16.

The determination unit 16 outputs power trend determination signals according to effective power P(t) at the future time T and effective power $P(T+\Delta T)$ at the future time $(T+\Delta T)$, current trend determination signals according to current effective value I(T) at the future time T and current effective value $I(T+\Delta T)$ at the future time $(T+\Delta T)$, and power determination signals according to effective power $P(T+\Delta T)$ and steady power $P_0$.

The out of phase prediction unit 17 always determines in which direction the operating point moves, from combination patterns of polarities of the power trend determination signals, current trend determination signals, and power determination signals, and monitors the relationship of the predicted effective power $P(T+\Delta T)$ and the steady power $P_0$. If any one of sets of conditions 1 and 2, conditions 3 and 4, and conditions 5 and 6 is satisfied, the unit 17 determines that an out of phase condition appears between T and $(T+\Delta T)$, and outputs an out of phase prediction signal to the parallel-off instruction unit 5.

In the out of phase prediction performed by the out of phase prediction unit 17, the conditions 1, 3 and 5 are based on:

$$P=P(T), \Delta P=P(T)-P(T-\Delta T), \Delta I=I(T)-I(T),$$

and the conditions 2, 4 and 6 are based on:

$$P=P(T=\Delta), \Delta P=P(T=\Delta T)-P(T), \Delta I=I(T+\Delta T)-I(T).$$

Figure 4:
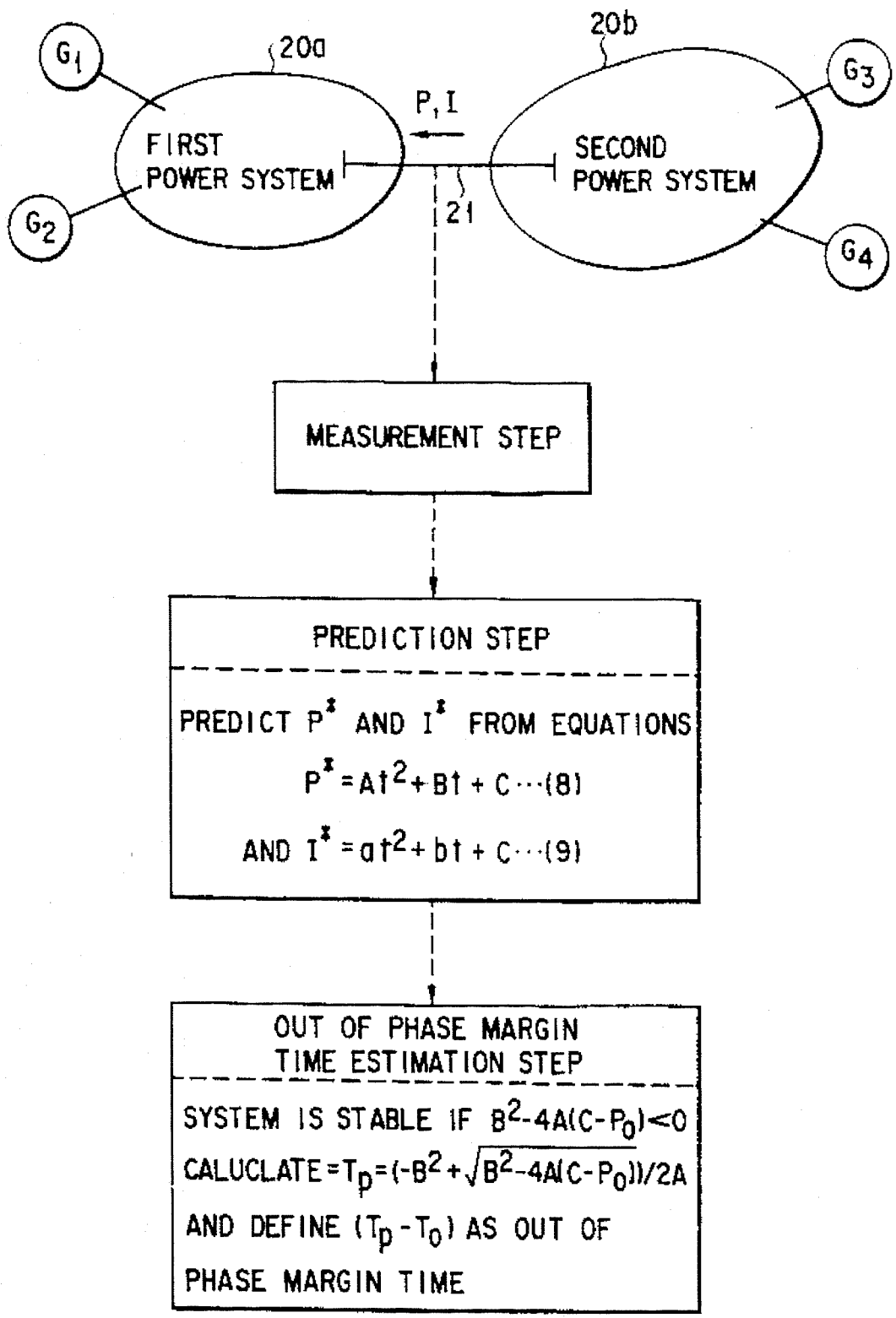
FIG. 4 is a schematic view showing a method for estimating a margin time required until the out of phase condition of the power systems occurs, by the stabilizing apparatus of FIG. 1.

FIG. 4 shows a process from measurement of voltage and current of the power systems until calculation of out of phase margin time.

The power/current prediction unit 15 calculates the following functions of predicting P and I, as described above.

$$P=At^2=Bt+C \tag{10}$$

$$I=at^2=bt+c \tag{11}$$

Figure 13:
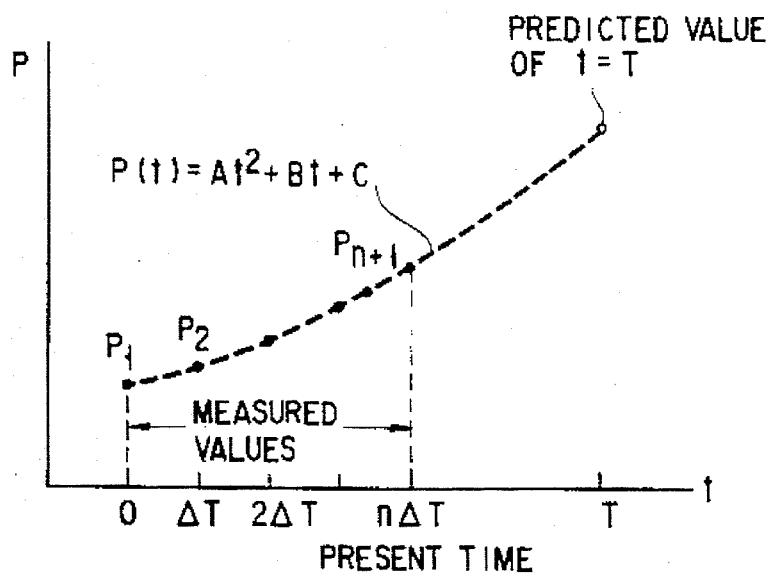
FIG. 13 is a graph showing a method for estimating a function of P for time t from measured values of P.
Figure 14A:
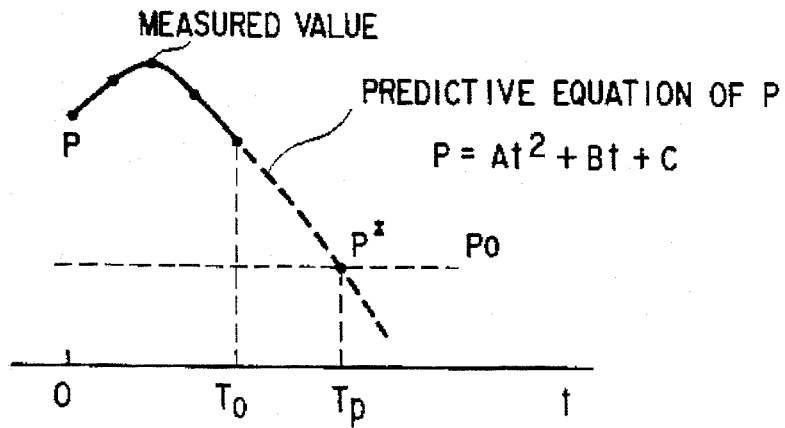
FIGS. 14A and 14B are diagrams for explaining a method for estimating time at which an out of phase is predicted.
Figure 14B:
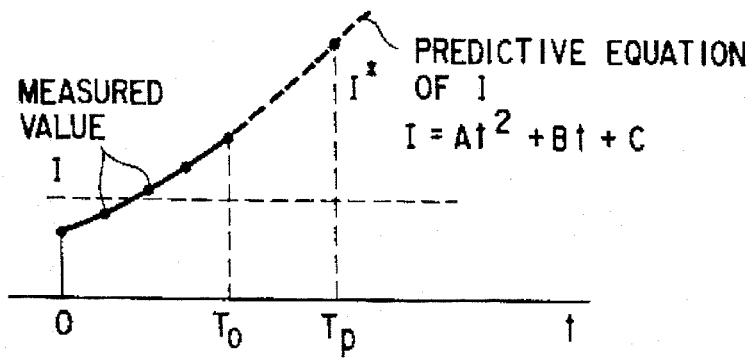

As shown in FIGS. 13 and 14, the coefficients A, B, C and a, b, c of these functions are determined so as to coincide with the values $P_1, P_2, \ldots, P_n$ and $I_1, I_2, \ldots, I_n$ measured at intervals $\Delta T$.

The out of phase margin time estimation unit 4 estimates the future time (out of phase prediction time) $T_p$ at which the predicted power $P^*$ is equal to $P_0$, based on the coefficients and the like determined by the power/current prediction unit 15.

Since the equation (10) is a quadratic equation, it is necessary to judge whether $P_0$) is present or not as the solution to the equation. Whether $P_0$) is present or not depends upon whether the following equation (12) has a real root. If the coefficients of the following equation (13) obtained from the equation (12) satisfy the following expression (14) and I increases monotonously, in other words, if the predicted current values at the future times T and (T+ΔT) increase as represented by the following expression (15), an out of phase occurs.

$$P_0 = At^2 + Bt + C \quad (12)$$

$$At^2 + Bt + (C - P_0) = 0 \quad (13)$$

$$(B^2 - 4A(C - P_0)) > 0 \quad (14)$$

$$I^*(T) > I^*(T + \Delta T) \quad (15)$$

The out of phase prediction time $T_p$ is calculated from the above equations (12) and (13). If the equation (13) is solved with respect to t, the following is obtained:

$$T_p = \{(-B +) (B^2 - 4A(C - P_0))^{1/2}\}/2A \quad (16)$$

If the present time $T_0$) is subtracted from the equation (16), the margin time $T_E$ required until the out of phase occurs is calculated as follows.

$$T_E = (T_p T_0) \quad (17)$$

If neither the expression (14) nor (15) is satisfied, it can be determined that no out of phase will occur. If the margin time $T_E$ is larger than a certain value, an error in prediction increases. Therefore, it is determined that the power system remains stable until a designated time if $T_E$ exceeds the designated time, but it is not certain whether the system is stable or not after the designated time. Usually, an out of phase condition appearing at the future time 0.2 to 1.0) second ahead of the present time, can be usually predicted, though the future time depends upon the arrangement, conditions, etc. of power systems.

Consequently, the out of phase margin time estimation unit 4 determines whether the expression (14) is satisfied by substituting the coefficients A, B and C and the steady power $P_0$) determined by the power/current prediction unit 15 for the expression (14), and also determines whether the expression (15) is satisfied, from I(T) and I(T+ΔT) predicted by the unit 15. If both the expressions (14) and (15) are satisfied, the coefficients A, B and C and the steady power $P_0$) determined by the unit 15 are substituted for the equation (16) to obtain the out of phase prediction time $T_p$. Then the margin time $T_E$ is calculated from the equation (17).

Figure 5:
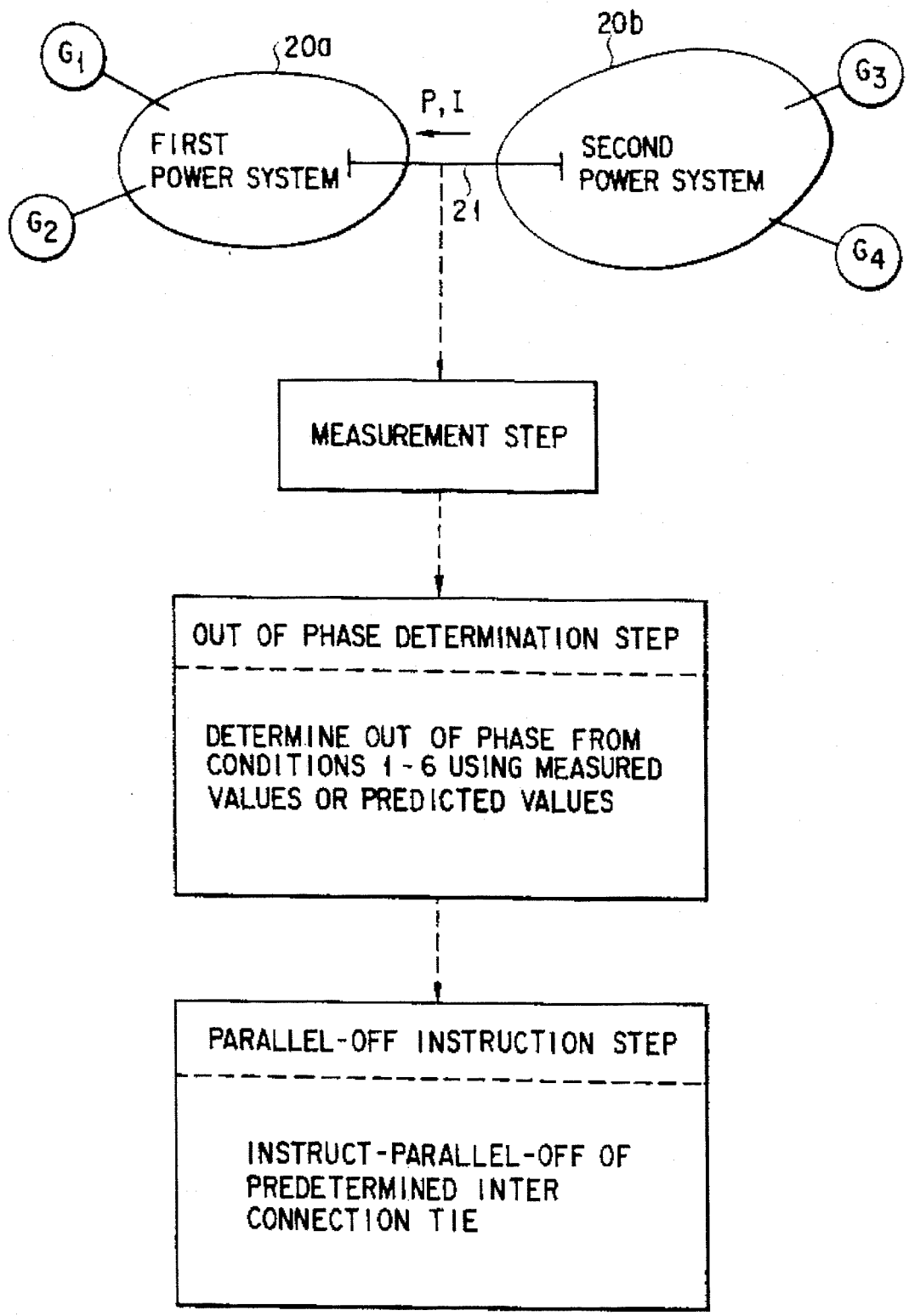
FIG. 5 is a flowchart showing a process of detecting/predicting the out of phase condition of the power systems and indicating the parallel-off of transmission lines of the power systems by the stabilizing apparatus of FIG. 1.

FIG. 5 shows a process from measurement of voltage and current of the power systems until instruction of parallel-off, when the out of phase determination block 2 determines that an out of phase occurs in the two groups of generators connected by the transmission line and outputs an out of phase detection signal, or when the out of phase prediction block 3 predicts that an out of phase will occur in the near future and outputs an out of phase prediction signal, the parallel-off instruction unit 5 opens a circuit breaker of the transmission line or a predetermined line constituting the transmission line.

In the above embodiment, the operations of the out of phase detection block 2 and out of phase prediction block 3, the estimation of the out of phase margin time, and the instruction of the parallel-off are described independently of one another. However, they can be performed by the sequence processing shown in the flowchart of FIGS. 15A and 15B.

More specifically, the measurement unit 1 measures effective power P and current effective value I at a predetermined cycle (step S1), and the power trend determination unit 11 and current trend determination unit 12 calculate ΔPt and ΔIt and then (P–P0) (step S2). The out of phase detection unit 14 to which the calculation results are input, determines whether the condition 2 is met or not (step S3). If the condition 2 is met, the unit 14 determines whether the condition 1 is met or not (step S4). If then the condition 1 is met in the step S4, the unit 14 determines that an out of phase condition has occurred between (t–Δt) and t (step S5).

If the conditions are not satisfied at the steps S3 and S4, P(T1), I(T1), P(T1+ΔT), and I(T1+ΔT) at the future times $T_1$ and $(T_1+\Delta T)$ are estimated (step S6). If the condition 1 is satisfied at $T_1$ and the condition 2 is satisfied at $(T_1+\Delta T)$, it is predicted that the out of phase condition will appear between $T_1$ and $(T_1+\Delta T)$ (step S7).

The time $T_p$ at which the predictive equation of P becomes equal to $P_0$, is calculated, and the margin time required until the out of phase condition appears is obtained (step S8). Then the system waits until the next time (t+Δt) (step S9).

The above-described apparatus according to the present invention has the following advantages.

(1) The out of phase condition occurring between the generators of the power systems connected by the interconnection tie, can be detected without using a threshold value according to the arrangement of the power systems, and the apparatus can be flexibly applied to a change in the arrangement of the power systems without changing the threshold value.

(2) Since the out of phase condition can be predicted, the lines of the interconnection tie can be paralleled off at early time. It is thus possible to lessen the influence of an increase in frequency due to the out of phase condition and to prevent a failure of one generator from influencing another generator. Further, it is possible to know the time (margin) from the present time to the time at which the out of phase condition appears, during the operation of the power systems.

(3) The out of phase can be prevented from occurring in the generators of the respective power systems.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An apparatus for detecting an oscillation of generator output power in power systems in order to stabilize the power systems, comprising:

a measurement device including a power detector which measures an effective power of an electrical signal at a tie point on an interconnection tie of the power systems at a predetermined cycle and a current detector which detects a current effective value of the electrical signal at the tie point on the interconnection tie of the power systems at the predetermined cycle;

power trend detection means to which the effective power is supplied in sequence from said measurement device, for comparing an effective power P(t) measured at time t and an effective power P(t–Δt) measured at time (t–Δt) which is a predetermined time Δt before the time t, and detecting a trend of the effective power;

current trend detection means to which the current effective value is supplied in sequence from said measurement device, for comparing a current effective value I(t) measured at the time t and a current effective value I(t–Δt) measured at the time (t–Δt), and detecting a trend of the current effective value;

power level determination means in which an effective power $P_o$ at steady state measured by said measurement device when the power systems are in a steady state is stored previously and to which the effective power is supplied in sequence from said measurement device, for determining whether the effective power P(t) is stronger than the effective power $P_o$ and outputting a power determination result; and out of phase detection means for detecting whether an out of phase condition occurs in the power systems, based on the trend of the effective power, the trend of the current effective value, and the power determination result.

2. The apparatus according to claim 1, wherein said power trend detection means subtracts the effective power P(t−Δt) from the effective power P(t) to obtain a subtraction value ΔP, and outputs a power trend signal indicative of a polarity of the subtraction value ΔP as the trend of the effective power;

said current trend detection means subtracts the current effective value I(t−Δt) from the current effective value I(t) to obtain a subtraction value ΔI, and outputs a current trend signal indicative of a polarity of the subtraction value ΔI as the trend of the current effective value;

said power level determination means subtracts the effective power $P_0$) at steady state from the effective power P(t) to obtain a subtraction value (P(t)−$P_0$) ), and outputs a power determination signal indicative of a polarity of the subtraction value (P(t)−$P_0$) ) as the power determination result; and said out of phase detection means determines whether the out of phase condition occurs in the power systems in response to a combination of the power trend signal, the current trend signal, and the power determination signal.

3. The apparatus according to claim 2, wherein said out of phase detection means determines that the out of phase has occurred in the power systems between the time (t−Δt) and the time t when the following condition 1 is satisfied at the time (t−Δt) and the following condition 2 is satisfied at the time t:

$(P−P_0)>0, \Delta P<0, \Delta I>0$  condition 1 where P=P(t−Δt), ΔP=P(t−Δt)−P(t−2Δt), ΔI=I(t−Δt)−I(t−2Δt), and $(P−P_0)>0, \Delta P<0, \Delta I>0$  condition 2 where P=P(t), ΔP=P(t)−P(t−Δt), ΔI=I(t)−I(t−Δt).

4. The apparatus according to claim 2, wherein said out of phase detection means determines that the out of phase has occurred in the power systems between the time (t−Δt) and the time t when the following condition 3 is satisfied at the time (t−Δt) and the following condition 4 is satisfied at the time t:

$(P−P_0)<0, \Delta P>0, \Delta I>0$  condition 3 where P=P(t−Δt), ΔP=P(t−Δt)−P(t−2Δt), ΔI=I(t−Δt)−I(t−2Δt), and $(P−P_0)<0, \Delta P>0, \Delta I<0$  condition 4 where P=P(t), ΔP=P(t)−P(t−Δt), ΔI=I(t)−I(t−Δt).

5. The apparatus according to claim 2, wherein said out of phase detection means determines that the out of phase has occurred in the power systems between the time (t−Δt) and the time t when the following condition 5 is satisfied at the time (t−Δt), the following condition 6 is satisfied at the time t, and a maximum value of the effective power P(t) is smaller than the effective power $P_0$ at the steady state:

$(P−P_0)<0, \Delta P>0, \Delta I>0$  condition 5 where P=P(t−Δt), ΔP=P(t−Δt)−P(t−2Δt), ΔI=I(t−Δt)−I(t−2Δt), and $(P−P_0)<0, \Delta P<0, \Delta I>0$  condition 6 where P=P(t), ΔP=P(t)−P(t−Δt), ΔI=I(t)−I(t−Δt).

6. The apparatus according to claim 1, further comprising means for opening the tie point or a line between the power systems when said out of phase detection means detects that the out of phase condition has occurred.

7. An apparatus according to claim 6, wherein said means for opening includes a circuit breaker.

8. An apparatus for detecting an out of phase condition occurring in power systems in order to stabilize the power systems, comprising:

a measurement device including a power detector which measures an effective power of an electrical signal at a tie point on an interconnection tie of the power systems at a predetermined cycle and a current detector which detects a current effective value of the electrical signal at the tie point on the interconnection tie of the power systems at the predetermined cycle;

prediction means to which the effective power and the current effective value are supplied in sequence from said measurement device, for predicting effective powers P(T) and P(T+ΔT) and current effective values I(T) and I(T+ ΔT) at future times T and (T+ΔT) in accordance with a trend of the effective power and the current effective value supplied from said measurement device;

power trend prediction means to which the predicted effective powers are supplied in sequence from said prediction means, for comparing the predicted effective powers P(T) and P(T+ΔT), and detecting a trend of the predicted effective power at the future time (T+ΔT);

current trend prediction means to which the predicted effective values are supplied in sequence from said prediction means, for comparing the predicted current effective values I(T) and I(T+ΔT), and detecting a trend of the predicted effective value at the future time (T+ΔT);

power level determination means in which an effective power $P_o$ at steady state measured by said measurement device when the power systems are in a steady state is stored previously and to which the predicted effective power P(T+ΔT) is supplied from said prediction means, for determining whether the predicted effective power P(T+ΔT) is stronger than the effective power $P_o$ at steady state and outputting a predicted power determination result; and out of phase prediction means for predicting whether an out of phase condition occurs in the power systems by the future time (T+ΔT), based on the trend of the predicted effective power, the trend of the predicted current effective value, and the power determination result.

9. The apparatus according to claim 8, wherein said prediction means determines coefficients A, B, C and D of the following function (1) and coefficients a, b, c and d of the following function (2) such that the coefficients coincide with effective powers $P_1, P_2, \ldots, P_{n+1}$ and current effective values $I_1, I_2, \ldots, I_{n+1}$ which are input in sequence from said measurement means at a time interval $\Delta T$ according to the predetermined cycle:

$$P = At^n + Bt^{n-1} \ldots Ct + D \qquad \text{function (1)}$$

$$I = at^n + bt^{n-1} \ldots ct + d \qquad \text{function (2)}$$

where t is start time (t=0) at which $P_1$ or $I_1$ is actually measured and n is an integer, the predicted effective powers P(T) and P(T+$\Delta$T) and the predicted current effective values I(T) and I(T+$\Delta$T) being calculated from the functions (1) and (2).

10. The apparatus according to claim 8, wherein said power trend prediction means subtracts the predicted effective power P(T) from the predicted effective power P(T+$\Delta$T) to obtain a subtraction value $\Delta$P, and outputs a predicted power trend signal indicative of a polarity of the subtraction value $\Delta$P as the trend of the predicted effective power;

said current trend prediction means subtracts the predicted current effective value I(T) from the predicted current effective value I(T+$\Delta$T) to obtain a subtraction value $\Delta$I, and outputs a predicted current trend signal indicative of a polarity of the subtraction value $\Delta$I as the trend of the predicted current effective value;

said power level determination means subtracts the effective power $P_0$ at steady state from the predicted effective power P(T+$\Delta$T) to obtain a subtraction value (P(T+$\Delta$T)–$P_0$), and outputs a predicted power determination signal indicative of a polarity of the subtraction value (P(T+$\Delta$T)–$P_0$) as the predicted power determination result; and said out of phase prediction means determines whether the out of phase condition occurs in the power systems in response to a combination of the predicted power trend signal, the predicted current trend signal, and the polarity of the predicted power determination signal.

11. The apparatus according to claim 10, wherein said out of phase prediction means predicts that the out of phase condition will occur in the power systems between the future time (T) and the future time (T+$\Delta$T) when the following condition 1 is satisfied at the future time (T) and the following condition 2 is satisfied at the future time (T+$\Delta$T):

$$(P-P_0) > 0, \Delta P > 0, \Delta I > 0 \qquad \text{condition 1}$$

where P=P(T), $\Delta$P=P(T)–P(T–$\Delta$T), $\Delta$I=I(T)–I(t–$\Delta$T), and $$(P-P_0) < 0, \Delta P < 0, I > 0 \qquad \text{condition 2}$$

where P=P(T+$\Delta$T), $\Delta$P=P(T+$\Delta$T)–P(T), $\Delta$I=I(T+$\Delta$T)–I(T).

12. The apparatus according to claim 10, wherein said out of phase prediction means predicts that the out of phase will occur in the power systems between the future time (T) and the future time (T+$\Delta$T) when the following condition 3 is satisfied at the future time (T) and the following condition 4 is satisfied at the future time (T+$\Delta$T):

$$(P-P_0) < 0, \Delta P > 0, I > 0 \qquad \text{condition 3}$$

where P=P(T+$\Delta$T), $\Delta$P=P(T+$\Delta$T)–P(T), $\Delta$I=I(T)–I(T–$\Delta$T), and $$(P-P_0) < 0, \Delta P > 0, \Delta I < 0 \qquad \text{condition 4}$$

where P=P(T+$\Delta$T), $\Delta$P=P(T+$\Delta$T)–P(T), $\Delta$I=I(T+$\Delta$T)–I(T).

13. The apparatus according to claim 10, wherein said out of phase prediction means predicts that the out of phase will occur in the power systems between the future time (T) and the future time (T+$\Delta$T) when the following condition 5 is satisfied at the future time (T), the following condition 6 is satisfied at the future time (T+$\Delta$T), and a maximum value of the predicted effective power P(T+$\Delta$T)) is smaller than the effective power $P_0$ at steady state:

$$(P-P_0) < 0, \Delta P > 0 \Delta I > 0 \qquad \text{conditions 5}$$

where P=P(T), $\Delta$P=P(T)–P(T–$\Delta$T), $\Delta$I=I(T)–I(T–$\Delta$T), and $$(P-P_0) < 0, \Delta P < 0 \Delta I > 0 \qquad \text{conditions 6}$$

where P=P(T+$\Delta$T), $\Delta$P=P(T+$\Delta$T)–P(T), $\Delta$I=I(T+$\Delta$T)–I(T).

14. The apparatus according to claim 8, further comprising means for opening the tie point or a predetermined line of the interconnection tie when said out of phase prediction means predicts that the out of phase will occur.

15. An apparatus according to claim 14, wherein said means for opening includes a circuit breaker.

16. An apparatus for detecting an out of phase condition occurring in power systems in order to stabilize the power systems, comprising:

a measurement device including a power detector which measures an effective power of an electrical signal at a tie point on an interconnection tie of the power systems at a predetermined cycle and a current detector which detects a current effective value of the electrical signal at the tie point on the interconnection tie of the power systems at the predetermined cycle;

prediction means to which the effective power and the current effective value are supplied in sequence from said measurement device, for predicting an effective power at a future time T in accordance with a trend of the effective power and the current effective value supplied from said measurement device;

determination means in which an effective power $P_o$ at steady state measured by said measurement device when the power systems are in a steady state is stored previously and to which the predicted effective power is supplied from said prediction means, for determining whether the effective power $P_o$ at steady state and the predicted effective power coincide with each other; and estimation means for estimating a time required until the effective power $P_o$ and the predicted effective power coincide with each other when said determination means determines that both the powers coincide.

17. The apparatus according to claim 16, wherein said prediction means determines coefficients A, B, C and D of the following function (1) and coefficients a, b, c and d of the following function (2) such that the coefficients coincide with effective powers $P_1, P_2, \ldots, P_{n+1}$ and current effective values $I_1, I_2, \ldots, I_{n+1}$ the most suitably, which are input in sequence from said measurement device at a time interval $\Delta T$ according to the predetermined cycle:

$$P = At^n + Bt^{n-1} \ldots Ct + D \qquad (1)$$

$$I = At^n + bt^{n-1} \ldots ct + d \qquad (2)$$

where t is start time (t=0) at which $P_1$ or $I_1$ is actually measured and n is an integer, the predicted effective powers P(T) and P(T+$\Delta$T) and the predicted current effective values I(T) and I(T+$\Delta$T) being calculated from the functions (1) and (2), and wherein said determination means determines whether the following determination equation (3) and (4) are satisfied:

$$(B^2 - 4A(C-P_0)) > 0 \qquad (3)$$

$$I(T) < I(T+\Delta T) \qquad (4)$$

and said estimation means estimates a time until the power systems becomes the out of phase condition from the following estimation equation (5):

$$T_p = \{(-B+)(B^2 - 4A(C-P_0))^{1/2}\}/(2A) \qquad (5).$$

18. An apparatus according to claim 16, wherein:

said estimation means also estimates a time until the power systems become the out of phase condition, and said apparatus further includes:

means for opening the tie point or a line between the power systems using the estimated time until the power systems become the out of phase condition.

19. An apparatus according to claim 18, wherein said means for opening includes a circuit breaker.

20. A method for detecting an out of phase condition occurring in power systems, comprising:

a measurement step of measuring an effective power signal of an electrical signal using a power detector and an effective current signal of the electrical signal using a current detector at a tie point on an interconnection tie of the power systems at a predetermined cycle;

a power trend detection step of detecting a trend of a plurality of effective power signals measured in sequence by said measurement step;

a current trend detection step of detecting a trend of a plurality of effective current signals measured in sequence by said measurement step;

a power level determination step of determining whether an effective power $P_o$) at steady state is stronger than each of the plurality of effective power signals measured in sequence by said measurement step; and an out of phase detection step of detecting whether an out of phase condition occurs in the power systems, based on trend of the effective power signals and outputting a power determination result, the trend of the effective current signals, and the power determination result.

21. A method according to claim 20, further comprising the step of:

opening a connection between the power systems when the out of phase detection step detects that the out of phase conditions occurs.

22. A method according to claim 21, wherein the opening step opens the connection by opening a circuit breaker.

23. A method for detecting an out of phase condition occurring in power systems, comprising:

a measurement step of measuring an effective power signal of an electrical signal using a power detector and an effective current signal of the electrical signal using a current detector at a tie point on an interconnection tie of the power systems at a predetermined cycle;

a prediction step of predicting effective power signals P(T) and P(T+ΔT) and effective current signals I(T) and I(T+ΔT) at future times T and (T+ΔT) in accordance with a trend of the effective power signal and the effective current signal measured by said measurement step;

a power trend prediction step of comparing the effective power signals P(T) and P(T+ΔT) predicted by said prediction step and detecting a trend of the predicted effective power at the future time (T+Δ);

a current trend prediction step of comparing the effective current signals I(T) and I(T+ΔT) predicted by said prediction step and detecting a trend of the predicted effective current signal at the future time (T+ΔT);

a power level determination step of determining whether the effective power $P_o$ at steady state of the power system is stronger than the effective power signal P(T+ΔT) predicted by said prediction step; and an out of phase prediction step of predicting whether an out of phase condition occurs in the power systems by the future time (T+ΔT), based on the trend of the predicted effective power signal, the trend of the predicted effective current signal, and the power determination result.

24. A method according to claim 23, further comprising the step of:

opening a connection between the power systems when the out of phase prediction step predicts that the out of phase condition occurs.

25. A method according to claim 24, wherein the opening step opens the connection by opening a circuit breaker.

26. A method for detecting an out of phase condition occurring in power systems, comprising:

a measurement step of measuring an effective power signal of an electrical signal using a power detector and an effective current signal of the electrical signal using a current detector at a tie point on an interconnection tie of the power systems at a predetermined cycle;

a prediction step of predicting an effective power signal at a future time in accordance with a trend of the effective power signal and the effective current signal measured in sequence by said measurement step;

a determination step of determining whether an effective power $P_o$ at steady state of the power systems and the effective power signal predicted by said prediction step coincide with each other; and an estimation step of estimating a time required until the effective power $P_o$ and the predicted effective power signal coincide with each other when it is determined by said determination step that the effective power $P_o$ and the predicted effective power signal coincide with each other.

27. A method according to claim 26, further comprising the step of:

opening a connection between the power systems using the time estimated by the estimation step.

28. A method according to claim 27, wherein the opening step opens the connection by opening a circuit breaker.

29. An apparatus for detecting an out of phase condition occurring in power systems in order to stabilize the power systems, comprising:

measurement means for measuring an effective power and a current effective value at a tie point on an interconnection tie of the power systems at a predetermined cycle;

prediction means to which the effective power and the current effective value are supplied in sequence from said measurement means, for predicting effective powers P(T) and P(T+ΔT) and current values I(T) and I(T+ΔT) at future times T and (T+ΔT) in accordance with a trend of the effective power and the current effective value supplied from said measurement means;

power trend prediction means to which the predicted effective powers are supplied in sequence from said prediction means, for comparing the predicted effective powers P(T) and P(T+ΔT), and detecting a trend of the predicted effective power at the future time (T+ΔT);

current trend prediction means to which the predicted effective values are supplied in sequence from said prediction means, for comparing the predicted current effective values I(T) and I(T+ΔT), and detecting a trend of the predicted effective value at the future time (T+ΔT);

power level determination means in which an effective power $P_o$ at steady state measured by said measurement means when the power systems are in a steady state is stored previously and to which the predicted effective power P(T+ΔT) is supplied from said prediction means, for determining whether the predicted effective power P(T+ΔT) is stronger than the effective power $P_o$ at steady state and outputting a predicted power determination result; and out of phase prediction means for predicting whether an out of phase condition occurs in the power systems by the future time (T+ΔT), based on the trend of the predicted effective power, the trend of the predicted current effective value, and the power determination result, the apparatus further comprising means for opening the tie point or a predetermined line of the interconnection tie when said out of phase prediction means predicts that the out of phase will occur.

* * * * *